United States Patent [19]
Scepanovic et al.

[11] Patent Number: 5,875,118
[45] Date of Patent: Feb. 23, 1999

[54] INTEGRATED CIRCUIT CELL PLACEMENT PARALLELIZATION WITH MINIMAL NUMBER OF CONFLICTS

[75] Inventors: Ranko Scepanovic, San Jose, Calif.; Alexander E. Andreev, Moskovskaga Oblast, Russian Federation; Ivan Pavisic, Cupertino, Calif.

[73] Assignee: LSI Logic Corporation, Milpitas, Calif.

[21] Appl. No.: 798,653

[22] Filed: Feb. 11, 1997

[51] Int. Cl.⁶ .................................................. G06F 17/50
[52] U.S. Cl. ........................ 364/491; 364/489; 364/490; 395/675
[58] Field of Search ................................ 364/488–491, 364/576; 395/675, 677

[56] References Cited

U.S. PATENT DOCUMENTS

| | | | |
|---|---|---|---|
| 5,144,563 | 9/1992 | Date et al. ............................. | 364/491 |
| 5,491,641 | 2/1996 | Scepanovic et al. .................. | 364/491 |
| 5,495,419 | 2/1996 | Rostoker et al. ...................... | 364/468 |
| 5,557,533 | 9/1996 | Koford et al. ......................... | 364/491 |
| 5,568,322 | 10/1996 | Azami et al. ......................... | 359/689 |
| 5,568,636 | 10/1996 | Koford ................................... | 395/500 |
| 5,578,840 | 11/1996 | Scepanovic et al. .................. | 257/207 |
| 5,615,128 | 3/1997 | Scepanovic et al. .................. | 364/489 |
| 5,636,125 | 6/1997 | Rostoker et al. ................. | 364/468.28 |
| 5,638,293 | 6/1997 | Scepanovic et al. .................. | 364/491 |
| 5,661,663 | 8/1997 | Scepanovic et al. .................. | 364/491 |
| 5,682,322 | 10/1997 | Boyle et al. ........................... | 364/491 |
| 5,694,602 | 12/1997 | Smith .................................... | 395/675 |
| 5,699,265 | 12/1997 | Scepanovic et al. .................. | 364/491 |
| 5,712,793 | 1/1998 | Scepanovic et al. .................. | 364/490 |
| 5,742,510 | 4/1998 | Rostoker et al. ................. | 364/468.03 |
| 5,745,363 | 4/1998 | Rostoker et al. ................. | 364/468.28 |

OTHER PUBLICATIONS

Woo et al. ("Load balancing on a hypercube", IEEE Comput. Soc. Press, Proceedings of the Fifth International Symposium on Parallel Processing, 30 Apr. 1991, pp. 525–530).

Chandy et al. ("A parallel circuit–partitioned algorithm for timing driven cell placement", IEEE, Proceedings of International Conference on Computer Design: VLSI in Computers and Processors, 1 Jan. 1997, pp. 621–627).

Sanchis ("Multiple–way network partitioning", IEEE Transactions on Computers, vol. 38, No. 1, pp. 62–81, Jan. 1989).

Rose et al. ("Parallel standard cell placement algorithms with quality equivalent to simulated annealing", IEEE Transactions on Computer–Aided Design of Integrated Circuits and Systems, vol. 7, No. 3, pp. 387–396, Mar. 1988).

Banerjee et al. ("Parallel Simulated Annealing Algorithms for Cell Placement on Hypercube Multiprocesors", IEEE Transactions on Parallel and Distributed Systems, vol. 1, NO. 1, Jan. 1990).

Qian et al. ("Load balancing on generalized hypercube and mesh multiprocessors with LAL", IEEE Comput. Soc. Press, 11th International Conference on Distributed Computing Systems, 20 May 1991, pp. 402–409).

Adachi et al. ("A parallel implementation of nonlinear steady state analysis based on time–domain Newton–Raphson algorithm", IEEE, 1989 IEEE International Symposium on Circuits and Systems, 8 May 1989, pp. 889–892).

*Primary Examiner*—Kevin J. Teska
*Assistant Examiner*—Phallaka Kik
*Attorney, Agent, or Firm*—Mitchell, Silberberg & Knupp LLP

[57] ABSTRACT

A method for maximizing effectiveness of parallel processing, using multiple processors, to achieve an optimal cell placement layout on an integrated circuit (IC) chip is disclosed. The method requires the cells of the IC to be assigned to one of the multiple processors in a manner to balance the work load among the multiple processors. Then, the affinity of the cells to each of the multiple processors is determined. The affinity of the cells, including the conflict reduction factors and work load balancing factors, is used to reassign the cells to the processors. The cell affinity calculation and the processor reassignment are repeated until no cells are reassigned or for a fixed number of times. The assignment of the cells to the multiple processors and subsequent reassignments of the cells based on affinity of the cells to the processors reduces or eliminates the problems associated with prior parallel cell placement techniques.

26 Claims, 2 Drawing Sheets

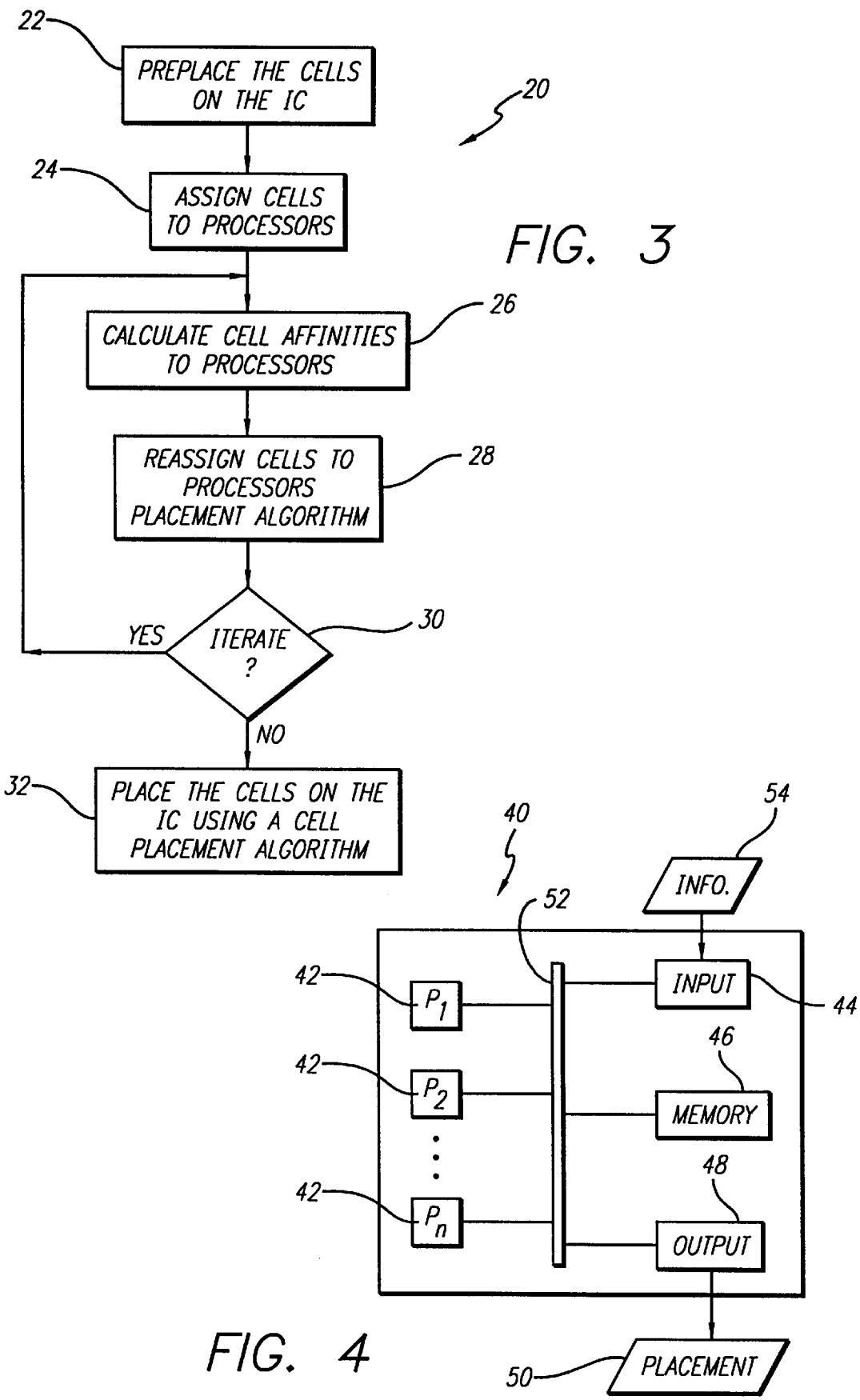

INTEGRATED CIRCUIT CELL PLACEMENT PARALLELIZATION WITH MINIMAL NUMBER OF CONFLICTS

BACKGROUND OF THE INVENTION

1. Field of the Invention

The present invention generally relates to the art of microelectronic integrated circuit layout, and more specifically to the art of placement of cells on integrated circuit chips.

2. Description of Related Art

Microelectronic integrated circuits (IC) consist of a large number of electronic components which are fabricated by layering several different materials on a silicon base or wafer. The design of an integrated circuit transforms a circuit description into a geometric description which is known as a layout. A layout consists of a set of planar geometric shapes in the various layers of the silicon chip.

The process of converting the specifications of an electrical circuit into a layout is called physical design. Physical design requires arranging elements, wires, and predefined cells on a fixed area. The process can be tedious, time consuming, and prone to many errors due to tight tolerance requirements and the minuteness of the individual components, or cells.

Currently, the minimum geometric feature size of a component is on the order of 0.5 microns. Feature size may be reduced to 0.1 micron within the next several years. The current small feature size allows fabrication of as many as 10 million transistors or approximately 1 million gates of logic on a 25 millimeter by 25 millimeter chip. This feature-size-decrease/transistor-increase trend is expected to continue, with even smaller feature geometries and more circuit elements on an integrated circuit. Larger chip sizes will allow far greater numbers of circuit elements.

Due to the large number of components and the exacting details required by the fabrication process, physical design is not practical without the aid of computers. As a result, most phases of physical design use extensively Computer Aided Design (CAD) tools. Automation of the physical design process has increased the level of integration, reduced turn around time and enhanced chip performance.

The object of physical chip design is to determine an optimal arrangement of devices in a plane and to find an efficient interconnection or routing scheme between the devices that results in the desired functionality. Since space on the chip surface is at a premium, algorithms must use the space very efficiently to lower costs and improve yield. The arrangement of individual cells in an integrated circuit chip is known as a cell placement.

Each microelectronic circuit device or cell includes a plurality of pins or terminals, each of which is connected to pins of other cells by a respective electrical interconnection wire network, or net. A purpose of the optimization process used in the physical design stage is to determine a cell placement such that all of the required interconnections can be made, but total wirelength and interconnection congestion are minimized.

Typical methods for achieving this goal include generating one or more initial placements and modifying the placement or placements using optimization methodologies such as simulated annealing, genetic algorithms (i.e. simulated evolution), and force directed placement. Each of these techniques involve iterative applications of the respective algorithms to arrive at an estimate of the optimal arrangement of the cells.

Depending on the input, placement algorithms are classified into two major groups, constructive placement algorithms and iterative improvement algorithms. The input to the constructive placement algorithms consists of a set of blocks along with the netlist. The algorithm provides locations for the blocks. Iterative improvement algorithms start with an initial placement. These algorithms modify the initial placement in search of a better placement. The algorithms are applied in a recursive or an iterative manner until no further improvement is possible, or the solution is considered to be satisfactory based on certain predetermined criteria.

Iterative algorithms function by generating large numbers of possible placements and comparing them in accordance with some criteria which is generally referred to as fitness. The fitness of a placement can be measured in a number of different ways, for example, overall chip size. A small size is associated with a high fitness and a large size is associated with a low fitness. Another measure of fitness is the total wire length of the integrated circuit. A high total wire length indicates low fitness and a low total wire length, on the other hand, indicates high fitness. One cell placement optimization system is described in U.S. patent application Ser. No. 08/672,725. Applicants hereby incorporate the specification, including the drawings, of said application herein as though set forth in full.

The relative desirability of various placement configurations can alternatively be expressed in terms of cost. Cost can be considered as the inverse of fitness, with high cost corresponding to low fitness and, similarly, lost cost corresponding to high fitness.

Iterative algorithms can be divided into three general classifications: simulated annealing, simulated evolution and force directed placement. The simulated annealing algorithm simulates the annealing process that is used to temper metals. Simulated evolution simulates the biological process of evolution, while the force directed placement simulates a system of bodies attached by springs.

Assuming that a number N of cells are to be optimally arranged and routed on an integrated circuit chip, the number of different ways that the cells can be arranged on the chip, or the number of permutations, is equal to N! (N factorial). In the following description, each arrangement of cells will be referred to as a placement. In a practical integrated circuit chip, the number of cells can be hundreds of thousands or millions. Thus, the number of possible placements is extremely large.

Because of the large number of possible placements, even computerized implementations of the placement algorithms discussed above can take many days. In addition, the placement algorithm may need to be repeated with different parameters or different initial arrangements to improve the results.

To reduce the time required to place optimally the cells, multiple processors have been used to speed up the process. In such implementations, multiple processors operate simultaneously in different regions of the chip to place the cells on the integrated chip. However, such prior efforts to reduce the cell placement time by parallel processing of placement methods have been impeded by crossover net conflicts, delays arising from inter-processor communication requirements, and uneven distribution of work among the multiple processors.

Referring to FIG. 1, a prior art technique of parallelizing cell placement algorithms is illustrated by the flowchart 10. The prior art methods have parallelized cell placement by first preplacing the cells on the chip 12 and dividing the chip into regions 14 each of which are assigned to a processor 16. The same cell placement algorithm is simultaneously executed by the multiple processors, each processor placing the cells located on its assigned regions of the chip 18. Each of the processors controls the cells located in its assigned regions. Then, each of the multiple processors analyze the placement of each of the cells located within its assigned regions to improve the overall placement of the cells 18. Several problems arise from the prior art technique.

The problems associated with the prior art parallelization technique can be illustrated using FIG. 2. FIG. 2 illustrates a grossly simplified IC with four nets 7, 9, 11, and 13 and four regions 8a, 8b, 8c, and 8d, each of which has been assigned to a processor.

The first problem is the crossover net problem. If the regions are divided such that crossover nets are created, then the effectiveness of the parallel processing technique is reduced. This is because none of the processors which share the crossover nets can accurately calculate the position of the (which is always the basis for the decision about the cell move) because the other processor may move its cell during the calculation. Naturally, as the number of processors increases, the number of crossover nets increases, aggravating the problem. A large number of crossover nets can be fatal for the convergence of cell placement algorithms. For example, in FIG. 2, nets 9, 11 and 13 are the crossover nets. Some cells of net 9 are processed by the processor assigned to region 8a while others are processed by the processor assigned to region 8c. Likewise, the cells of nets 11 and 13 are placed by processors assigned to regions 8a and 8b, and 8b and 8d, respectively.

Second, cell movements from one region (or processor) to another creates communications overhead which may negate the advantages of multiple processor cell placement technique. Each time a cell is moved from one region to another, the processor moving the cell from its assigned region must communicate with the processor receiving the cell to its assigned region. The communication requirement complicates the implementation of cell placement algorithms and slows down both of the communicating processors. As the number of processors, the number of cells, or the number of required cell moves increase, the communication overhead increases. In particular, the performance of the parallel processing technique is especially poor if the spring density levelization method is used as the cell placement algorithm because the algorithm tends to make global cell moves.

Third, to minimize crossover nets and communications overheads, the prior art parallelization techniques typically require a "good" preplacement of the cells on the chip. That is, in order to operate effectively, the prior art methods require the nets to be within a single region and the cells of the nets to be "close" to each other. The best way to achieve this is to increase the region size and decrease the number of processors running in parallel. However, the increase in the region size and the decrease in the number of parallel processors defeat the purpose of parallelizing the cell placement algorithm. Moreover, even with such preplacement of cells, there are generally still many crossover nets.

In order to avoid the problems associated with crossover nets, regions have to be made larger. Use of large regions has the disadvantage in that it limits the number of processors that can be used. In fact, if the entire integrated chip is defined as one region, and only one processor is assigned to place the cells of the chip, then there would be no crossover net problems or communications overhead; but, there also is no parallel processing, and the cell placement becomes a sequential process. Finally, the prior art technique of assigning regions of the IC to each of the multiple processors lead to the problem of unbalanced work load. Because each of the regions may contain varying number of nets, cells, or cells requiring further movements, it is difficult to assign regions to the processors so as to assign equal amount of work to each of the processors. Consequently, some processors finish the placement of the cells of its assigned regions more quickly than other processors, reducing the effectiveness of parallelization of the placement algorithm.

In summary, because of the ever-increasing number of cells on an integrated chips (currently at millions of cells on a chip), and the resulting increase in the number of possible placements of the cells on the chip, a computer is used to find an optimal layout of the cells on the chip. Even with the aid of computers, existing methods can take several days to place a large number of cells, and these methods may need to be repeated with different parameters or different initial arrangements. To decrease the time required to place the cells on an integrated circuit chip, multiple processors have been used to perform the placement of the cells. However, the use of multiple processors has led to crossover net conflicts, inter-processor communication problems, cell preplacement requirements, and uneven distribution of work problems, negating the advantages of using the multiple processors.

SUMMARY OF THE INVENTION

The present invention uses a cell affinity optimization technique to accomplish four goals. The first goal is to minimize the number of crossover net conflicts. The second goal is to reduce the inter-processor communications. The third goal is to eliminate the requirement, under the prior art, that the cell preplacement must be "good" in order for the parallel processing of the placement algorithm to perform effectively. And finally, the fourth goal is to balance evenly between the processors.

According to the present invention, there is provided a method of placing elements on a surface by assigning the elements, rather than regions of the surface, to a plurality of processors and having each of the processors place its assigned elements on the chip. The elements are assigned to the chips so as to balance the workload among the processors. In particular, the method is used to place cells on an integrated circuit chip (IC).

To reduce crossover nets and inter-processor communications overhead, the affinities of the individual cells to each of the multiple processors are calculated, and the affinity values are used to reassign the cells to other processors. However, the affinity values are also weighed against the processor work load to maintain a balanced work load among the processors. In addition, because the processors are assigned to cells instead of regions, the cell placement algorithms become inherently less dependent upon the initial placement of the cells on the integrated circuit.

An apparatus for parallelizing implementation of cell placement algorithms comprises a plurality of processors and memory. The memory stores instructions for the processors to assign the cells, not regions, of the integrated circuit chip to said processors and simultaneously place the cells on the integrated circuit.

The parallelization technique of the present invention can be modified for different placement algorithms because the method describes a way to implement any placement algorithm using multiple processors operating simultaneously.

These and other aspects, features, and advantages of the present invention will be apparent to those persons having ordinary skilled in the art to which the present invention relates from the foregoing description and the accompanying drawings.

BRIEF DESCRIPTION OF THE DRAWINGS

FIG. 3 is a flowchart illustrating the steps taken by the parallel processing technique of the present invention for simultaneous cell placement; and FIG. 4 is a diagram of the cell placement apparatus according to the present invention.

DETAILED DESCRIPTION OF THE PREFERRED EMBODIMENT(S)

Figure 1:
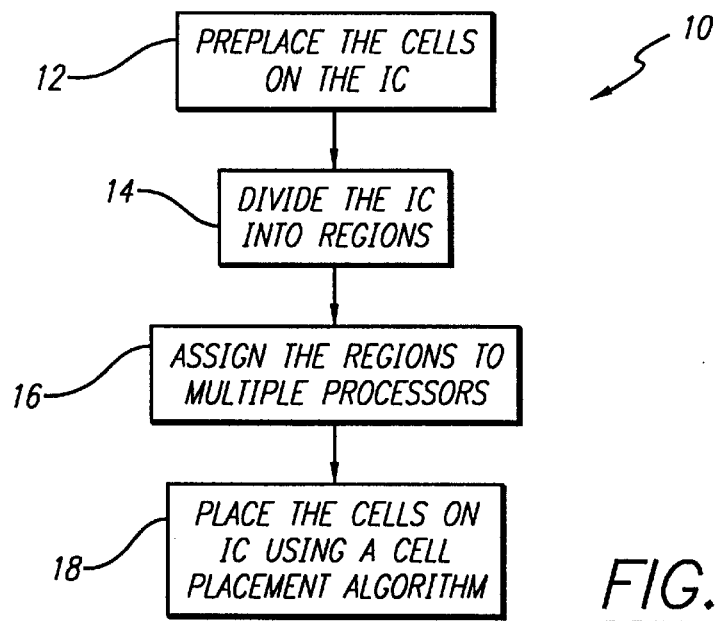
FIG. 1 is a flowchart illustrating the steps taken by prior art parallel processing technique for simultaneous cell placement.
Figure 2:
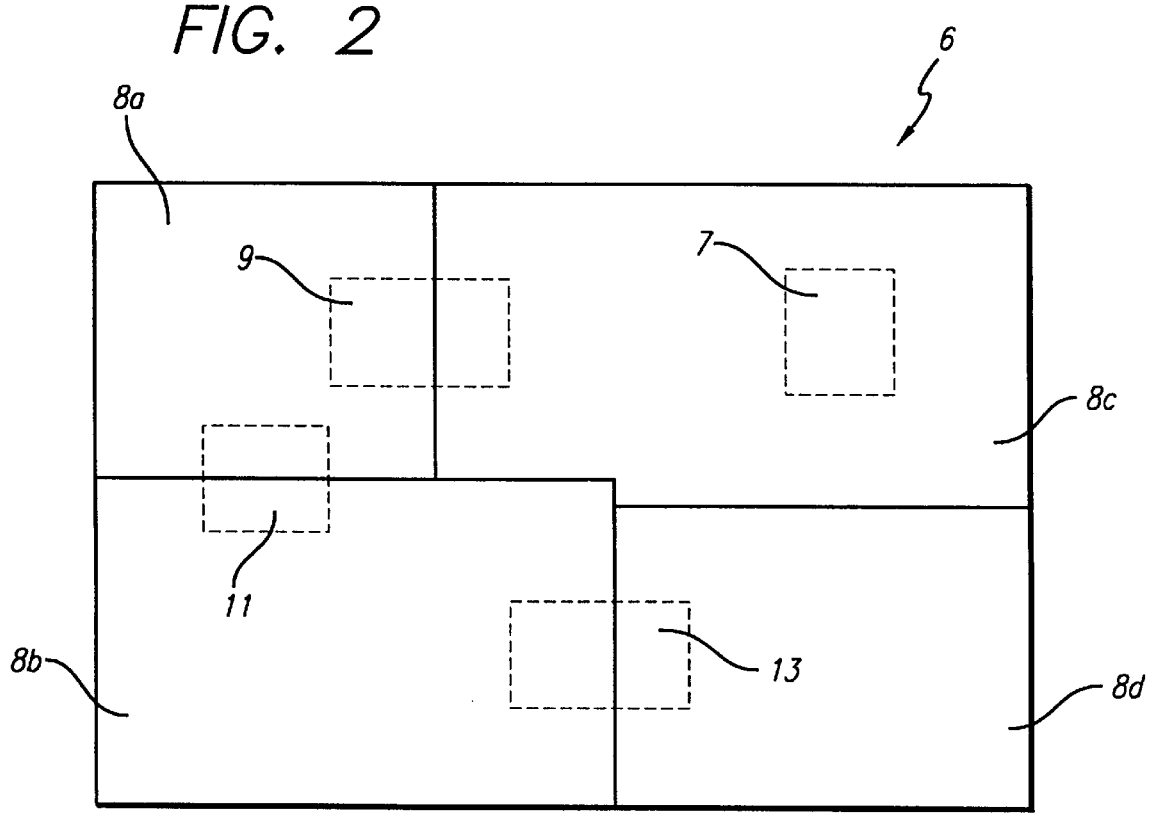
FIG. 2 illustrates an integrated circuit chip.

Referring now to FIG. 3, a flowchart 20 illustrates the steps taken by the parallel processing technique of the present invention for simultaneous cell placement. As indicated by reference numeral 22, the cells are preplaced onto the IC. However, unlike the preplacement 12 of FIG. 2, the technique of the present invention does not necessitate a "good" preplacement. As discussed above, prior art techniques require "good" preplacement of the cells to minimize crossover nets and inter-processor communications overheads. In contrast, the preplacement step of the present invention is merely a step to provide a starting point for the cell placement algorithm being implemented.

As indicated by the reference numeral 24, each of the cells of the IC are assigned to one of the multiple processors which will be used to place the cells onto the IC. The details of the method for assigning the cells to the processors are discussed in the Assigning Cells to Processors section below. Because the cells, not the regions, of the IC are assigned to the processors, and because the cells of the same net will generally be assigned to the same processor (as will be discussed below), the crossover net problems are minimized. Also, each of the multiple processors can be assigned to approximately the same number of cells or cells requiring movements, thereby balancing the work load among the processors. Starting from the initial assignment 22, the number of conflicts are reduced by reassigning 28 the cells to other processors while keeping the processors' loads balanced.

After the initial assignment of cells to the processors, the cells can be reassigned between the processors 26 to further reduce possible crossover net problems and to increase the efficiency of parallelization of the cell placement algorithm. This is done by calculating the affinities of the cells to each of the multiple processors, and reassigning the cells to different processors to increase the overall affinity of the system. The affinity of a cell to a processor can be defined as the degree of tendency of the cell to belong with the other cells of that processor. The details of the affinity calculation and the reassignment of the cells are discussed in the Affinity Calculation and Cell Reassignment section below.

As indicated by reference numeral 28, the affinity calculation 26 and the cell reassignments 28 are iterated for a predetermined number of times or until a predetermined condition is met such as no further improvement or no further increase in the overall cell affinity.

To facilitate the discussion of the present invention, the following terms are used in this specification:

| | |
|---|---|
| NC | the number of cells of the integrated circuit; |
| NN | the number of nets; |
| NP | the number of processors; |
| $C_1, \ldots, C_{NC}$ | the cells; |
| $N_1, \ldots, N_{NN}$ | the nets; |
| $P_1, \ldots, P_{NP}$ | the available processors; and |
| $time(C_i)$ | the runtime that the placement algorithm needs to make the decision about moving the cell $C_i$. |

The value of $time(C_i)$ for each of the cells can be obtained experimentally or by estimate based on the specific placement algorithm being implemented. $Time(C_i)$ usually depends on the number of nets to which the cell belongs, or the cell degrees. Then, the total time needed to perform all cell moves, or the total_load, can be expressed as $$\text{total\_load} = \sum_{i=1}^{NC} time(C_i)$$

Assigning Cells to Processors

As discussed above, the work load can be evenly distributed among the processors by assigning, to each of the processors, the average_load where the average_load is $$\text{average\_load} = \frac{\text{total\_load}}{NP}$$

Unlike the prior art techniques where the processors are assigned to regions of the IC, the present invention assigns the cells of the IC to each of the processors. For the initial assignment, the cells are divided into parts with the equal total times. More precisely, the following method is used. First, beginning with the first cell, $C_1$, we find a set, containing minimum number of cells, with a total time(C) which is greater than or equal to the average_load. This is accomplished by finding the minimal $i_1$ such that $$\sum_{i=1}^{i_1} time(C_i) \geq \text{average\_load}$$

and the found set of cells $\{C_1, \ldots, C_{i1}\}$ are assigned to the first processor $P_1$. Then, the process is repeated beginning with the cell $C_{i1+1}$. Then, we find the next set of cells $\{C_{i1+1}, \ldots, C_{i2}\}$ where $$\sum_{i=i_1+1}^{i_2} time(C_i) \geq \text{average\_load}$$

and assign the set to $P_2$, and so on until all the cells are assigned to a processor. At the end of the process, an even distribution of the work load is achieved because each of the processors $P_1$ to $P_{NP-1}$ are assigned to a set of cells with total work load equal to or slightly more than the average_load. The last processor, $P_{NP}$, is assigned to a set of cells with total work load equal to or slightly less than the average_load.

For each processor $P_k$, the work load of the processor can be defined as $$load(P_k) = \sum_{C_i \text{ is assigned to } P_k} time(C_i)$$

Affinity Calculation and Cell Reassignment

The reduction of crossover nets and inter-processor communications can be achieved by assigning the cells to processors to obtain the highest affinity value for the entire system. In this invention, the affinity of a cell to switch from the currently assigned processor to another processor consists of two parts. The first one is the reduction in number of conflicts and the second one controls the processors' load balance. Assuming that cell $C_i$ is currently assigned to processor $P_k$, its affinity to switch to processor $P_j$ is determined by:

$$\text{affinity}(C_i, P_j) = \text{netlist\_affinity}(C_i, P_j) + \lambda \cdot \text{load\_affinity}(C_i, P_j)$$

and we define cell_affinity ($C_i$) as the greatest of these affinities, or the greatest affinity of the cell $C_i$ to switch from its currently assigned processor $P_k$ to any of the other processor $P_j$, i.e., $$\text{cell\_affinity}(C_i) = \max_{1 \leq j \leq NP} \text{affinity}(C_i, P_j)$$

The netlist_affinity($C_i$, $P_j$) is the total reduction in number of crossover net conflicts if we reassign the cell $C_i$ from the current processor $P_k$ to the processor $P_j$. The reduction in the conflicts can be calculated as the difference between the number of conflicts the net, to which the cell belongs to, produces before and after the movement of the cell. Thus, the value of netlist_affinity($C_i$, $P_j$) depends upon the method used to calculate the number of conflicts caused by a net.

The best way to calculate the number of conflicts caused by net N, denoted as conflicts(N), is to maintain an array ($a_1$, ..., $a_{NP}$) for each net N where each $a_j$ represents the number of cells from net N currently assigned to processor Pj. Then, the conflicts(N) for any N is $$\text{conflicts}(N) = \sum_{1 < i < NP, i \neq j} a_i$$

Alternatively, conflicts(N) can be the number of different processors having cells from the net N minus 1.

Yet another method to determine conflicts(N) is to assign 1 if cells from N are assigned to more than one processor and 0 otherwise.

The load_affinity is the work load balancing factor and is determined by $$\text{load\_affinity}(C_i, P_j) = \frac{\text{load}(P_k) - \text{load}(P_j)}{\text{average\_load}}$$

A constant, $\lambda$, may be used as the weighing factor to shift the relative importance between the netlist_affinity and the load_affinity. A small constant value would reduce the relative effect of the load_affinity factor in the overall affinity calculation, thereby giving the netlist_affinity factor a relatively larger role in the determination of the affinity. In this case, the cells of the integrated circuit are more likely to be reassigned to processors based upon the reduction in the number of conflicts the reassignment will effect. On the other hand, a larger constant value would increase the relative effect of the load_affinity factor in the overall affinity calculation, thereby giving the load_affinity factor a relatively larger role in the determination of the affinity. Consequently, the cells of the integrated circuit are more likely to be reassigned to processors based upon work load balance among the processors.

Once the cell affinities are calculated as discussed above, the cells are reassigned 28 among the processors to increase the overall affinity of the system. To avoid local minimum, we do not reassign all the cells with positive affinity, but only certain percentage p of them (usually, p=40). Then we find the number threshold such that p% of positive affinities are greater than threshold.

In all subsequent iterations 30, we calculate affinities again and reassign cells with the affinity greater than threshold by moving the cell from the current processor to the one that cell has the maximal affinity to.

The number of iterations 30 can fixed, or repeated until a predetermined condition is met such as no further improvements are possible.

Referring now to FIG. 4, an apparatus 40 for parallelizing cell placement with minimal number of conflicts is illustrated. The apparatus 40 comprises a plurality of processors 42 and memory 46 for storing instructions for the processors 42 as described above. The processors 42 may be of any commercially produced RISC or CISC processors commonly made by a number of vendors, or custom made processors such as LSI Logic's CoreWare modules. The processors and the memory is connected 52. Also connected to the processors 42 and memory 46 are an input device 44 and an output device 48 for retrieving the IC information, the cell list, and the preplacement information 54 to the apparatus 40 and for outputting the final cell placement information 50.

The specific algorithms described herein, as well as the basic steps which they represent (even if they are replaced by different algorithms), are designed for implementation in a general purpose computer. Furthermore, each of the algorithms described herein, as well as the basic steps it represents, can be encoded on computer storage media such as CD ROMS, floppy disks, computer harddrives, and other magnetic, optical, other machine readable media, whether alone or in combination with one or more of the algorithms and steps described herein.

Although the present invention has been described in detail with regard to the exemplary embodiments and drawings thereof, it should be apparent to those skilled in the art that various adaptations and modifications of the present invention may be accomplished without departing from the spirit and the scope of the invention. Thus, by way of example and not of limitation, the present invention is discussed as illustrated by the figures. Accordingly, the invention is not limited to the precise embodiment shown in the drawings and described in detail hereinabove.

We claim:

1. A method of placing elements on a surface, said method comprising:

a preplacing step of preplacing the elements on the surface;

an assigning step of assigning each of the elements to one of a plurality of processors, including assigning a first element to a first processor:

an affinity determining step of determining affinity of said first element to a second processor;

a reassigning step of reassigning said first element from said first processor to said second processor based on said affinity subsequent to said assigning step but prior to determining a new placement of the first element; and a determining step of determining new placements of the elements on the surface by using for each element the processor assigned to said each element.

2. The method according to claim 1 wherein said affinity is determined by identifying a second processor to which said first element has highest affinity.

3. The method according to claim 1 wherein said affinity is a combination of netlist affinity and load affinity.

4. The method according to claim 3 wherein a weighing factor is multiplied to said load affinity prior to said load affinity being combined to said netlist affinity.

5. The method according to claim 3 wherein said netlist affinity is reduction in number of conflicts generated if said first element is assigned to said first processor to conflicts generated if said first element is assigned to said second processor.

6. The method according to claim 1 wherein the elements are cells of an integrated circuit chip (IC), and the surface is the IC.

7. A computer-implemented method of placing cells on an integrated circuit chip, said method comprising:
   an assigning step of assigning each of the cells to one of a plurality of processors;
   a determining step of determining cell affinity of each of the cells to each of said plurality of processors;
   a reassigning step of reassigning cells meeting a predetermined affinity criterion to another processor, said reassigning step being performed after said assigning step and without moving the cells that are reassigned; and
   a placing step of placing the cells on the integrated circuit chip by using for each cell the processor assigned to said each cell.

8. The method of placing cells according to claim 7 further comprising the step of preplacing the cells on the integrated circuit chip prior to said step of assigning each of the cells to said plurality of processors.

9. The method of placing cells according to claim 7 wherein the cells are assigned to said processors to balance processor work load.

10. The method of placing cells according to claim 7 wherein said placing of each of the cells on the integrated circuit chip requires work, and said step of assigning each of the cells to said processors comprises substeps:
    determining a total load of the system to place all of the cells by adding the work required to place each of the cells;
    determining an average load to be placed upon each of said processors by dividing said total load by the number of processors;
    assigning a first cell to a first processor;
    assigning additional cells to said first processor until the amount of work assigned to said first processor, determined by adding the work required to place said first cell and said additional cells, is not less than said average load;
    assigning a second cell, not yet assigned to any of said processors, to a second processor, not yet assigned to cells; and
    assigning other cells, not yet assigned to any of said processors, to said second processor until the amount of work assigned to said second processor, determined by adding the work required to place said second cell and said other cells, is not less than said average load.

11. The method of placing cells according to claim 7 wherein said step of determining cell affinity for each of the cells comprises substeps:
    determining netlist affinity of the cell to each of the processors;
    determining load affinity of the cell to each of the processors;
    combining said netlist affinity and said load affinity of the cell to each of the processors; and
    selecting the largest value from said combination.

12. The method according to claim 11 wherein said load affinity is multiplied by a weighing factor prior to said step of combining said load affinity with said netlist affinity.

13. The method according to claim 11 wherein said netlist affinity is a reduction in number of conflicts.

14. The method according to claim 13 wherein each of said cells belongs to a net.

15. The method according to claim 14 wherein said conflict of a first cell is determined using a method comprising the steps:
    determining a first net to which said first cell belongs;
    identifying the cells belonging to said first net;
    identifying the processors assigned to each of said identified cells; and
    counting the number of identified cells assigned to each of said identified processors.

16. The method according to claim 14 wherein said netlist affinity of a first cell, assigned to a first processor, is determined using a method comprising the steps:
    determining a first net to which the first cell belongs;
    identifying the cells belonging to said first net;
    assigning a value of zero to said netlist affinity if all of said identified cells are assigned to said first processor; and
    assigning a value of one to said netlist affinity if a second cell of said identified cells belong to a second processor.

17. The method according to claim 11 wherein said load affinity for each of the cells is determined by a method comprising the steps:
    determining a first load of a first processor from which the cell is reassigned;
    determining a second load of a second processor to which the cell is reassigned;
    determining an average load; and
    subtracting said second load from said first load and dividing the difference by said average load.

18. The method according to claim 17 wherein said placing of each of the cells requires work.

19. The method according to claim 18 wherein,
    said first load is determined by summing the work required to place each of the cells assigned to said first processor;
    said second load is determined by summing the work required to place each of the cells assigned to said second processor; and
    said average load is determined by summing the work required to place all of the cells of the integrated circuit and dividing said sum by the number of processors.

20. A method of placing cells on an integrated circuit chip, said method comprising steps of:
    a. assigning a first cell to a first processor;
    b. assigning a second cell to a second processor;
    c. determining cell affinity of said first cell to said second processor;
    d. reassigning said first cell to said second processor based on said cell affinity without moving said first cell; and
    e. placing said first cell and said second cell on the integrated circuit chip.

21. The method of placing cells according to claim 20 further comprising the step of preplacing said first and second cells on the integrated circuit chip prior to said step of assigning said first cell to said first processor.

22. A parallel cell placement system comprising:
    a computer having memory and a plurality of processors; and said memory having instructions for said processors to simultaneously place the cells on the integrated circuit while minimizing conflicts between said processors by determining cell affinities for a plurality of said processors, reassigning cells to processors based on the cell affinities without moving the cells that are reassigned, and placing the cells after said reassignment.

23. An apparatus for placing cells on an integrated circuit comprising:

a plurality of processors; and memory connected to said processors, said memory having instructions for said processors to:
  a. assign the cells to said processors;
  b. determining cell affinities for a plurality of said processors; and
  c. reassign at least one of the cells to a different processor based on at least one of the cell affinities without moving said at least one cell.

24. The apparatus according to claim 23 further comprising an input device and an output device.

25. A computer storage medium for storing instructions, said instructions comprising:

an assigning step of assigning each of the cells to one of a plurality of processors;

a determining step of determining cell affinity of each of the cells to each of said plurality of processors;

a reassigning step of reassigning cells meeting a predetermined affinity criterion to another processor, said reassigning step being performed after said assigning step and without moving the cells that are reassigned; and a placing step of placing the cells on the integrated circuit chip by using for each cell the processor assigned to said each cell.

26. The computer storage medium according to claim 25 wherein said storage medium is selected from a group consisting of magnetic device, optical device, magneto-optical device, floppy diskette, CD-ROM, harddrive, memory, tape, disk, and solid state memory card.

* * * * *